(12) United States Patent
Maekawa et al.

(10) Patent No.: US 10,629,796 B2
(45) Date of Patent: Apr. 21, 2020

(54) LAMINATE AND THERMOELECTRIC CONVERSION ELEMENT

(71) Applicant: TDK CORPORATION, Tokyo (JP)

(72) Inventors: Kazuya Maekawa, Tokyo (JP); Makoto Shibata, Tokyo (JP); Katsuyuki Nakada, Tokyo (JP); Yohei Shiokawa, Tokyo (JP); Kazuumi Inubushi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/924,828

(22) Filed: Mar. 19, 2018

(65) Prior Publication Data
US 2018/0287037 A1 Oct. 4, 2018

(30) Foreign Application Priority Data
Mar. 30, 2017 (JP) .................. 2017-068914

(51) Int. Cl.
*H01L 35/20* (2006.01)
*H01L 35/00* (2006.01)
(Continued)

(52) U.S. Cl.
CPC .............. *H01L 35/32* (2013.01); *H01L 35/00* (2013.01); *H01L 35/20* (2013.01); *H01L 35/22* (2013.01);
(Continued)

(58) Field of Classification Search
CPC ......... H01L 35/32; H01L 35/22; H01L 35/20; H01L 35/00; H01L 39/125; H01L 41/04; H01L 39/12; H01L 35/06; H01L 33/105; H01L 21/02304; H01L 35/04; H01L 35/08; H01L 35/14; H01L 35/02; H01L 21/02197; H01L 28/55; H01L 45/147; H01F 1/408

See application file for complete search history.

(56) References Cited

U.S. PATENT DOCUMENTS

| 5,753,934 A | 5/1998 | Yano et al. |
| 6,258,459 B1 * | 7/2001 | Noguchi ................. B32B 15/04 |
| | | 428/446 |

(Continued)

FOREIGN PATENT DOCUMENTS

| JP | H01-215963 A | 8/1989 |
| JP | H08-186182 A | 7/1996 |

(Continued)

OTHER PUBLICATIONS

Anna Koziol-Rachwal, "The effect of the MgO buffer layer thickness on magnetic anisotropy in MgO/Fe/Cr/MgO buffer/MgO(001)" Journal of Applied Physics 120, 085303 (2016).*

(Continued)

*Primary Examiner* — Michael Y Sun
(74) *Attorney, Agent, or Firm* — Oliff PLC

(57) ABSTRACT

A laminate includes, on a substrate, a first buffer layer substantially made of zirconium oxide or stabilized zirconia, a second buffer layer substantially made of yttrium oxide, a metal layer substantially made of at least one among platinum, iridium, palladium, rhodium, vanadium, chromium, iron, molybdenum, tungsten, aluminum, silver, gold, copper, and nickel, and a magnesium oxide layer substantially made of magnesium oxide, in this order.

16 Claims, 8 Drawing Sheets

(51) Int. Cl.
  *H01L 35/32* (2006.01)
  *H01L 35/22* (2006.01)
  *H01L 21/02* (2006.01)
  *H01L 49/02* (2006.01)
  *H01F 1/40* (2006.01)
  *H01L 45/00* (2006.01)
  *H01L 35/06* (2006.01)
  *H01L 33/10* (2010.01)
  *H01L 35/04* (2006.01)
  *H01L 35/08* (2006.01)
  *H01L 35/14* (2006.01)
  *H01L 35/02* (2006.01)
  *H01L 39/12* (2006.01)
  *H01L 41/04* (2006.01)

(52) U.S. Cl.
  CPC ........ *H01F 1/408* (2013.01); *H01L 21/02197* (2013.01); *H01L 21/02304* (2013.01); *H01L 28/55* (2013.01); *H01L 33/105* (2013.01); *H01L 35/02* (2013.01); *H01L 35/04* (2013.01); *H01L 35/06* (2013.01); *H01L 35/08* (2013.01); *H01L 35/14* (2013.01); *H01L 39/12* (2013.01); *H01L 39/125* (2013.01); *H01L 41/04* (2013.01); *H01L 45/147* (2013.01)

(56) References Cited

U.S. PATENT DOCUMENTS

| 2009/0137400 | A1 | 5/2009 | Hahakura et al. |
| 2012/0276702 | A1* | 11/2012 | Yang ............ H01L 27/11582 438/270 |
| 2013/0014798 | A1* | 1/2013 | Nishide ............ H01L 35/20 136/205 |
| 2015/0236244 | A1* | 8/2015 | Kijima ............ H01L 41/319 428/446 |

FOREIGN PATENT DOCUMENTS

| JP | H09-110592 A | 4/1997 |
| JP | H11-312801 A | 11/1999 |
| JP | 2007-311234 A | 11/2007 |
| JP | 2013-021089 A | 1/2013 |
| WO | 2016/129082 A1 | 8/2016 |
| WO | WO-2016129082 A1 * | 8/2016 ............ H01L 35/32 |

OTHER PUBLICATIONS

Jifeng Sun "Thermoelectric properties of n-type SrTiO3" APL Materials 4, 104803 (2016).*

Yamamoto et al., "Effect of defects in Heusler alloy thin films on spin-dependent tunnelling characteristics of Co2MnSi/MgO/Co2MnSi and Co2MnGe/MgO/Co2MnGe magnetic tunnel junctions", J. Phys. : Condens. Matter, vol. 22, 164212, pp. 1-9, 2010.

* cited by examiner

LAMINATE AND THERMOELECTRIC CONVERSION ELEMENT

BACKGROUND

The disclosure relates to a laminate and a thermoelectric conversion element provided with a layer having a predetermined crystal structure on the laminate. Priority is claimed on Japanese Patent Application No. 2017-068914, filed Mar. 30, 2017, the content of which is incorporated herein by reference.

In recent years, various thermoelectric conversion elements utilizing the thermoelectric properties of materials have been examined. Examples thereof include power generation elements utilizing the Seebeck effect caused by a temperature difference between the outside air and a human body, and power generation elements utilizing waste heat from an automobile, an incinerator, a heater, or the like. $Bi_2Te_3$ is a material that is currently put to practical use as a thermoelectric conversion material. This material has high conversion efficiency. However, since both Bi and Te as the constituent elements are expensive and Te is toxic, it is difficult to achieve mass production, a reduction in costs, and a reduction in environmental burdens. Therefore, there is a demand for a highly efficient thermoelectric conversion material replacing $Bi_2Te_3$.

As candidates for non-toxic and inexpensive thermoelectric conversion materials, Heusler alloys such as $Fe_2VAl$ have attracted attention. There has been consideration of techniques for thin film crystallization to further improve the thermoelectric properties of such Heusler alloys (PCT International Publication No. WO2016/129082 and Japanese Unexamined Patent Application, First Publication No. 2013-21089). Thin film crystallization has attracted attention as a technique for improving element properties not only in the technical field of thermoelectric conversion but also in the technical fields related to high-temperature superconductivity, oxide electronics for ferroelectric materials or the like, and spintronics for magnetic materials or the like.

In a case where a Heusler alloy such as $Fe_2VAl$ is subjected to thin film crystallization for the purpose of improving the properties of a thermoelectric conversion element, it is preferable to use a MgO substrate as an underlying substrate from the viewpoint of controlling the crystal orientation. Furthermore, even when a thin film of a high-temperature superconductor, a ferroelectric material related to oxide electronics, or a magnetic material related to spintronics is formed, it is preferable to use a MgO substrate as an underlying substrate. However, since the MgO substrate is expensive, it is difficult to put a thermoelectric conversion element, a high-temperature superconductor, a magnetic material, and the like utilizing the MgO substrate as a substrate to practical use as products.

SUMMARY

It is desirable to provide a laminate which can be formed at a low cost and enables the formation of a thin-film-crystallized film.

A laminate according to an embodiment of the disclosure includes: on a substrate, a first buffer layer substantially made of zirconium oxide or stabilized zirconia; a second buffer layer substantially made of yttrium oxide; a metal layer substantially made of at least one among platinum, iridium, palladium, rhodium, vanadium, chromium, iron, molybdenum, tungsten, aluminum, silver, gold, copper, and nickel; and a magnesium oxide layer substantially made of magnesium oxide, in this order.

DETAILED DESCRIPTION

Figure 1A:
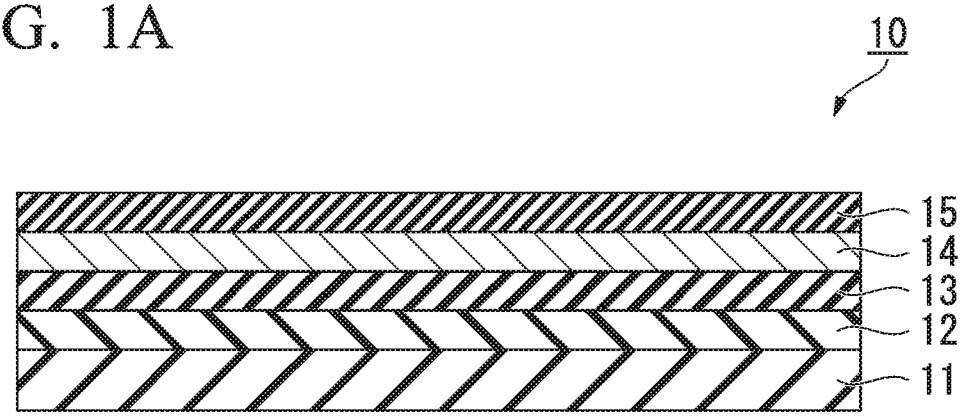
FIGS. 1A and 1B are sectional views schematically illustrating a laminate according to an embodiment of the disclosure.

Hereinafter, some embodiments of the disclosure will be described in detail with reference to the drawings as appropriate. In the drawings used in the following description, in order to facilitate understanding of the features of the disclosure, there are cases where characteristic portions are enlarged for the sake of convenience, and the dimensional ratio and the like of each constituent element are different from the reality. Materials, dimensions, and the like exemplified in the following description are merely examples, and the present invention is not limited thereto and can be carried out in appropriate modifications within a range that exhibits the effects of the disclosure. An element of the disclosure may include other layers within a range that exhibits the effects of the disclosure.

[Laminate]

FIG. 1A is a sectional view schematically illustrating a configuration of a laminate 10 according to an embodiment of the disclosure. The laminate 10 primarily includes a first buffer layer 12, a second buffer layer 13, a metal layer 14, and a magnesium oxide layer 15 in this order on a substrate 11. The laminate 10 primarily includes the first buffer layer 12, the second buffer layer 13, the metal layer 14, and the magnesium oxide layer 15 in order from a side of the substrate 11 in the lamination direction.

As the substrate 11, a substrate made of various single crystals such as silicon (Si), titanium oxide ($TiO_2$), aluminum (Al), cobalt (Co), copper (Cu), iron (Fe), nickel (Ni), and zinc (Zn) can be used. In particular, it is preferable to use a substrate having a Si(100) single crystal surface.

The first buffer layer 12 is substantially made of zirconium oxide or stabilized zirconia. That is, although the first buffer layer 12 contains zirconium oxide or stabilized zirconia as a primary component, the composition thereof may deviate from the stoichiometric composition within a range that does not influence the effects of the disclosure and may contain a small amount of impurities. The first buffer layer 12 can be formed by, for example, a vapor deposition method or a sputtering method.

When a rare earth element is represented by R, the composition of the first buffer layer 12 can be represented by $Zr_{(1-x)}R_xO_2$. Here, x=0 to 0.6 is satisfied. Zirconium oxide ($ZrO_2$) having a composition in the case of x=0 undergoes a phase transition from cubic to tetragonal and then monoclinic in a range from a high temperature to room temperature but is stabilized in the cubic phase by an addition of a rare earth element or an alkaline earth element. Zirconium oxide to which a rare earth element or an alkaline earth element is added is generally called stabilized zirconia.

It is preferable to add a rare earth element as an element for stabilization to zirconium oxide forming the first buffer layer 12. As the rare earth element to be added, a rare earth element which can adjust the lattice constant of a stabilized zirconia thin film so as to match the lattice constant of another thin film or substrate in contact with the stabilized zirconia thin film is selected. Specifically, an element consisting of at least one of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) is selected.

The thickness of the first buffer layer 12 may be appropriately determined such that the epitaxial film is formed, the surface thereof is flat, and cracks are not generated. The thickness is preferably 5 nm or more and 1000 nm or less, and more preferably 20 nm or more and 100 nm or less.

The second buffer layer 13 is substantially made of yttrium oxide ($Y_2O_3$). That is, although the second buffer layer 13 contains yttrium oxide as a primary component, the composition thereof may deviate from the stoichiometric composition within a range that does not influence the effects of the disclosure and may contain a small amount of impurities. Yttrium oxide is compatible with the zirconia-based material of the first buffer layer 12. The second buffer layer 13 can be formed, for example, by a vapor deposition method or a sputtering method.

The second buffer layer 13 is an epitaxial film with cubic (100) orientation, tetragonal (001) orientation, or monoclinic crystal (001) orientation. By sequentially laminating the first buffer layer 12 and the second buffer layer 13 described above on the substrate 11, a (111) facet is formed at the interface of the second buffer layer 13 with the metal layer 14. Recesses having a depth of about 0.56 nm in a direction perpendicular to the plane are formed in the facet.

The thickness of the second buffer layer 13 is preferably 5 nm or more and 1000 nm or less, and more preferably 25 nm or more and 100 nm or less.

The metal layer 14 is epitaxially grown on the (111) facet of the second buffer layer 13. The metal layer 14 is substantially made of a metal material consisting of at least one among platinum (Pt), iridium (Ir), palladium (Pd), rhodium (Rh), vanadium (V), chromium (Cr), iron (Fe), molybdenum (Mo), tungsten (W), aluminum (Al), silver (Ag), gold (Au), copper (Cu), and nickel (Ni) (a simple substance of the corresponding metal elements or an alloy of two or more of the corresponding metal elements). That is, although the metal layer 14 contains the corresponding metal material as a primary component, the composition thereof may deviate from the stoichiometric composition within a range that does not influence the effects of the disclosure and may contain a small amount of impurities.

Since each of the metal materials forms cubic crystals having a lattice constant of 0.56 nm or less, the recesses of the facet can be buried by the growth of the metal layer 14 containing the materials. Therefore, the surface of the final metal layer 14 becomes a surface parallel to the surface (principal surface) of the substrate 11 or a surface with high flatness. The surface becomes a cubic (100) plane but may also become a tetragonal (001) plane due to a distortion of the crystal lattice or the like.

Since the lattice spacing of the bottom side of the facet is about 0.39 nm, a metal material substantially consisting of at least one among platinum, iridium, palladium, and rhodium (a simple substance of the corresponding metal elements or an alloy of two or more of the corresponding metal elements), which easily match the lattice spacing thereof (which have lattice constants close to the lattice spacing thereof), is more preferable as the material of the metal layer 14.

The metal layer 14 is epitaxially grown in C-axis orientation in succession to the C-axis orientation of the buffer layer and has a function of causing the magnesium oxide layer 15 as an upper layer to be epitaxially grown along the C-axis.

The metal layer 14 may also be formed of two or more thin films having different compositions. Since the metal layer 14 plays a role of absorbing stress, the metal layer 14 exhibits an effect of preventing the generation of cracks in a thin film formed on the metal layer 14.

Although a film-forming method is not limited as long as a deposition rate, a film forming temperature, and a film forming pressure at which a single crystal film can be formed are satisfied, for example, the metal layer 14 can be formed by using a deposition method or a sputtering method. When the substrate temperature is too low, it is difficult to obtain a film with high crystallinity, and when the substrate temperature is too high, the surface irregularities of the film tend to be large.

The thickness of the metal layer 14 may be appropriately determined such that the epitaxial film is formed, the surface thereof is flat, and cracks are not generated. The thickness is preferably 5 nm or more and 1000 nm or less, and more preferably 50 nm or more and 100 nm or less.

The magnesium oxide layer 15 is substantially made of magnesium oxide (MgO). That is, although the magnesium oxide layer 15 contains magnesium oxide as a primary component, the composition thereof may deviate from the stoichiometric composition within a range that does not influence the effects of the disclosure and may contain a small amount of impurities. Magnesium oxide is a cubic system material and is preferably epitaxially grown on a metal thin film. Furthermore, a film of magnesium oxide having a quality equivalent to that of a single crystal substrate can be obtained by growing magnesium oxide in (100) C-axis orientation.

The thickness of the magnesium oxide layer 15 may be appropriately determined such that an epitaxial film is formed, the surface thereof is flat, and cracks are not generated. The thickness is preferably 5 nm or more and 1000 nm or less, and more preferably 25 nm or more and 100 nm or less.

Figure 1B:

FIG. 1B is a sectional view schematically illustrating a configuration of a laminate 10A according to a modified example of the embodiment. The laminate 10A has a third buffer layer 16 between the metal layer 14 and the magnesium oxide layer 15. The third buffer layer 16 has a function of improving the crystallinity of the magnesium oxide layer 15 on the upper layer side. The configurations of the other layers are the same as those of the laminate 10 illustrated in FIG. 1A.

The third buffer layer 16 is substantially made of at least one among: nickel oxide, strontium titanate, strontium ruthenate, lead lanthanum zirconate titanate, lead zirconate titanate, vanadium, chromium, iron, molybdenum, tungsten, aluminum, silver, gold, iron aluminum, yttrium aluminum, cobalt aluminum, nickel aluminum, ruthenium aluminum, rhodium aluminum, palladium aluminum, iridium aluminum, yttrium copper, gold bismuth, iron titanium, titanium cobalt, titanium nickel, titanium rhodium, titanium palladium, titanium iridium, and tantalum ruthenium; a binary alloy of silver and X; a binary alloy of iron and Y; and a ternary alloy of nickel, aluminum, and Z. That is, although the third buffer layer 16 contains the material selected therefrom as a primary component, the composition thereof may deviate from the stoichiometric composition within a range that does not influence the effects of the disclosure and may contain a small amount of impurities.

As the binary alloy of silver and X (a binary alloy represented by AgX), an alloy in which X is any of aluminum, manganese, copper, gallium, germanium, arsenic, yttrium, lanthanum, cerium, praseodymium, neodymium, samarium, europium, gadolinium, terbium, dysprosium, erbium, ytterbium, and platinum and the compositional ratio of X to silver (Ag) is adjusted may be used as the third buffer layer 16.

As the binary alloy of iron and Y (a binary alloy represented by FeY), an alloy in which Y is any of aluminum, silicon, gallium, molybdenum, silver, and gold and the compositional ratio of Y to iron (Fe) is adjusted may be used as the third buffer layer 16.

As the ternary alloy of nickel, aluminum and Z (a ternary alloy represented by NiAlZ), an alloy in which Z is any of silicon, scandium, titanium, chromium, manganese, iron, cobalt, copper, zirconium, niobium, and tantalum and the compositional ratio between the three elements nickel (Ni), aluminum (Al), and Z is adjusted may be used as the third buffer layer 16.

The thickness of the third buffer layer 16 may be appropriately determined such that the epitaxial film is formed, the surface thereof is flat, and cracks are not generated. The thickness is preferably 5 nm or more and 1000 nm or less, and more preferably 25 nm or more and 100 nm or less.

Depending on the material of the metal layer 14, the in-plane rotation angle of the crystal lattice of the magnesium oxide layer 15 with respect to the crystal lattice of the metal layer 14 is determined. In other words, a suitable material for the metal layer 14 varies depending on the in-plane rotation angle of the crystal lattice of the magnesium oxide layer 15 with respect to the crystal lattice of the metal layer 14. Furthermore, in a case where the third buffer layer 16 is present, the in-plane rotation angle of the crystal lattice of the magnesium oxide layer 15 with respect to the crystal lattice of the metal layer 14 is determined by the material of the metal layer 14, and the in-plane rotation angle of the crystal lattice of the third buffer layer 16 with respect to the crystal lattice of the metal layer 14 is determined by the material of the metal layer 14 and the material of the third buffer layer 16. In other words, suitable materials for the metal layer 14 and the third buffer layer 16 vary depending on the in-plane rotation angles of the crystal lattices of the third buffer layer 16 and the magnesium oxide layer 15 epitaxially grown with respect to the crystal lattice of the metal layer 14.

In a case where the crystal lattice of the magnesium oxide layer 15 is not in-plane rotated with respect to the crystal lattice of the metal layer 14, as a suitable material for the metal layer 14, a material having a lattice constant close to the lattice constant of magnesium oxide may be employed, and specifically, simple substances of the metal elements described in the upper part of Table 1 and alloys of two or more of the metal elements may be employed. In a case where the third buffer layer 16 is present and the crystal lattice of any of the third buffer layer 16 and the magnesium oxide layer 15 is not in-plane rotated with respect to the crystal lattice of the metal layer 14, as a suitable material for the metal layer 14, a material having a lattice constant close to the lattice constant of magnesium oxide may be employed, and specifically, simple substances of the metal elements described in the upper part of Table 1 and alloys of two or more of the metal elements may be employed. As a suitable material for the third buffer layer 16, a material in which "the lattice constant of the material of the third buffer layer 16" or "1/n (n is an integer) of the lattice constant of the material of the third buffer layer 16" is close to the lattice constant of the material of the metal layer 14 and the lattice constant of magnesium oxide may be employed, and specifically, those described in the lower part of Table 1 may be employed.

TABLE 1

| Metal layer | Crystal structure | Lattice constant [nm] | Lattice constant of MgO a1 [nm] |
|---|---|---|---|
| Pt | fcc | 0.3923 | 0.4212 |
| Ir | fcc | 0.3839 | 0.4212 |
| Pd | fcc | 0.3890 | 0.4212 |
| Rh | fcc | 0.3716 | 0.4212 |
| Cu | fcc | 0.3615 | 0.4212 |
| Ni | fcc | 0.3524 | 0.4212 |
| Al | fcc | 0.4050 | 0.4212 |
| Ag | fcc | 0.4090 | 0.4212 |
| Au | fcc | 0.4080 | 0.4212 |

| Third buffer layer | Crystal structure | Lattice constant a2 [nm] | a2/2 [nm] |
|---|---|---|---|
| Ag | fcc | 0.4090 | |
| $Ag_{0.06}Pt_{0.94}$ | Cu | 0.3929 | |
| $Ag_{0.5}Au_{0.5}$ | Cu | 0.4077 | |
| $Ag_{0.5}Cu_{0.5}$ | Cu | 0.3877 | |
| $Ag_{0.5}Fe_{0.5}$ | Cu | 0.4030 | |
| $Ag_{0.5}Ni_{0.5}$ | Cu | 0.3830 | |
| $Ag_{0.5}Pd_{0.5}$ | Cu | 0.3911 | |
| $Ag_{0.5}Pt_{0.5}$ | Cu | 0.3980 | |
| $Ag_{0.65}Li_{0.35}$ | Cu | 0.4042 | |
| $Ag_{0.67}Pt_{0.33}$ | Cu | 0.4004 | |
| $Ag_{0.79}Al_{0.21}$ | Cu | 0.4065 | |
| $Ag_{0.84}Ga_{0.16}$ | Cu | 0.4072 | |
| $Ag_{0.84}Ge_{0.16}$ | Cu | 0.4090 | |
| $Ag_{0.84}Mn_{0.16}$ | Cu | 0.4085 | |
| $Ag_{0.91}Pt_{0.09}$ | Cu | 0.4058 | |
| $Ag_{0.935}Er_{0.065}$ | Cu | 0.4099 | |
| $Ag_{0.93}As_{0.07}$ | Cu | 0.4097 | |
| $Ag_{0.95}Dy_{0.05}$ | Cu | 0.4091 | |
| $Ag_{0.95}Gd_{0.05}$ | Cu | 0.4096 | |
| $Ag_{0.95}Tb_{0.05}$ | Cu | 0.4097 | |
| $Ag_{0.975}Pr_{0.025}$ | Cu | 0.4087 | |
| $Ag_{0.97}Cu_{0.03}$ | Cu | 0.4088 | |
| $Ag_{0.97}Nd_{0.03}$ | Cu | 0.4087 | |
| $Ag_{0.98}Ce_{0.02}$ | Cu | 0.4087 | |
| $Ag_{0.98}Y_{0.02}$ | Cu | 0.4092 | |
| $Ag_{0.9975}Eu_{0.0025}$ | Cu | 0.4089 | |
| $Ag_{0.9975}Sm_{0.0025}$ | Cu | 0.4087 | |
| $Ag_{0.99}La_{0.01}$ | Cu | 0.4086 | |
| $Ag_{0.99}Yb_{0.01}$ | Cu | 0.4088 | |

TABLE 1-continued

| | | | | |
|---|---|---|---|---|
| Al | fcc | 0.4050 | | |
| Au | fcc | 0.4080 | | |
| $Au_{0.5}Fe_{0.5}$ | Cu | 0.3946 | | |
| $Fe_{0.1}Al_{0.9}$ | Cu | 0.4040 | | |
| $Mo_{0.73}Fe_{0.27}$ | Cu | 0.3860 | | |
| $Au_2Bi$ | $MgCu_2$ | 0.7942 | 0.3971 | |
| $YAl_2$ | $MgCu_2$ | 0.7855 | 0.3928 | |
| NiO | NaCl | 0.4190 | | |
| $SrTiO_3$, $Sr(Ti,Nb)O_3$ | perovskite | 0.3905 | | |
| $SrRuO_3$ | perovskite | 0.3950 | | |
| PZT | perovskite | 0.4036 | | |
| PLZT | perovskite | 0.4080 | | |

In such cases, it is preferable that the difference between the lattice constant of the material of the metal layer 14 and the lattice constant of magnesium oxide be within 8% of the lattice constant of magnesium oxide. It is preferable that the difference between "the lattice constant of the material of the third buffer layer 16" or "1/n (n is an integer) of the lattice constant of the material of the third buffer layer 16" and the lattice constant of the material of the metal layer 14 be within 8% of the lattice constant of the material of the metal layer 14. It is preferable that the difference between "the lattice constant of the material of the third buffer layer 16" or "1/n (n is an integer) of the lattice constant of the material of the third buffer layer 16" and the lattice constant of the magnesium oxide be within 8% of the lattice constant of magnesium oxide. It is preferable that "the lattice constant of the material of the third buffer layer 16" or "1/n (n is an integer) of the lattice constant of the material of the third buffer layer 16" have a magnitude between the lattice constant of the material of the metal layer 14 and the lattice constant of magnesium oxide.

In a case where the third buffer layer 16 is present and with respect to the crystal lattice of the metal layer 14, the crystal lattice of the third buffer layer 16 is 45° in-plane rotated and the crystal lattice of the magnesium oxide layer 15 is not in-plane rotated, as a suitable material for the metal layer 14, a material having a lattice constant close to the lattice constant of magnesium oxide may be employed, and specifically, simple substances of the metal elements described in the upper part of Table 2 and alloys of two or more of the metal elements may be employed. As a suitable material for the third buffer layer 16, a material in which "$2^{1/2}$ (the square root of 2) times the lattice constant of the material of the third buffer layer 16" or "1/n (n is an integer) of $2^{1/2}$ (the square root of 2) times the lattice constant of the material of the third buffer layer 16" is close to the lattice constant of the material of the metal layer 14 and the lattice constant of magnesium oxide may be employed, and specifically, those described in the lower part of Table 2 may be employed.

TABLE 2

| Metal layer | Crystal structure | Lattice constant [nm] | Lattice constant of MgO a1 [nm] |
|---|---|---|---|
| Pt | fcc | 0.3923 | 0.4212 |
| Ir | fcc | 0.3839 | 0.4212 |
| Pd | fcc | 0.3890 | 0.4212 |
| Rh | fcc | 0.3716 | 0.4212 |
| Cu | fcc | 0.3615 | 0.4212 |
| Ni | fcc | 0.3524 | 0.4212 |
| Al | fcc | 0.4050 | 0.4212 |
| Ag | fcc | 0.4090 | 0.4212 |
| Au | fcc | 0.4080 | 0.4212 |

| Third buffer layer | Crystal structure | Lattice constant a2 [nm] | $b2 = a2 \times \sqrt{2}$ [nm] | $b3 = (a2 \times \sqrt{2})/2$ [nm] | $b4 = (a2 \times \sqrt{2})/4$ [nm] |
|---|---|---|---|---|---|
| $Au_3Bi_7$ | bcc, PO, simple lattice | 0.3115 | 0.4405 | | |
| CoAl | bcc, CsCl | 0.2864 | 0.4050 | | |
| Cr | bcc | 0.2880 | 0.4073 | | |
| Fe | bcc | 0.2870 | 0.4059 | | |
| $Fe_{0.75}Al_{0.25}$ | $BiF_3$ | 0.5790 | | 0.4094 | |
| $Fe_{0.75}Ga_{0.25}$ | $BiF_3$ | 0.5807 | | 0.4106 | |
| $Fe_{0.75}Si_{0.25}$ | $BiF_3$ | 0.5600 | | 0.3960 | |
| FeAl | bcc, CsCl | 0.2898 | 0.4099 | | |
| IrAl | bcc, CsCl | 0.2985 | 0.4221 | | |
| NiAl | bcc, CsCl | 0.2860 | 0.4045 | | |
| RhAl | bcc, CsCl | 0.2980 | 0.4214 | | |
| TiCo | bcc, CsCl | 0.3002 | 0.4245 | | |
| TiFe | bcc, CsCl | 0.2979 | 0.4213 | | |
| TiNi | bcc, CsCl | 0.3015 | 0.4264 | | |
| TiRh | bcc, CsCl | 0.3126 | 0.4421 | | |
| V | bcc | 0.3030 | 0.4285 | | |
| $Ti_2Co$ | $Ti_2Ni$ | 1.1288 | | | 0.3991 |
| $Ti_2Fe$ | $Ti_2Ni$ | 1.1328 | | | 0.4005 |
| $Ti_2Ni$ | $Ti_2Ni$ | 1.1319 | | | 0.4002 |

In this case, it is preferable that the difference between the lattice constant of the material of the metal layer 14 and the lattice constant of magnesium oxide be within 8% of the lattice constant of magnesium oxide. It is preferable that the difference between "$2^{1/2}$ times the lattice constant of the material of the third buffer layer 16" or "1/n (n is an integer) of $2^{1/2}$ times the lattice constant of the material of the third buffer layer 16" and the lattice constant of the material of the metal layer 14 be within 8% of the lattice constant of the material of the metal layer 14. It is preferable that the difference between "$2^{1/2}$ times the lattice constant of the material of the third buffer layer 16" or "1/n (n is an integer) of $2^{1/2}$ times the lattice constant of the material of the third buffer layer 16" and the lattice constant of the magnesium oxide be within 8% of the lattice constant of magnesium oxide. It is preferable that "$2^{1/2}$ times the lattice constant of the material of the third buffer layer 16" or "1/n (n is an integer) of $2^{1/2}$ times the lattice constant of the material of the third buffer layer 16" have a magnitude between the lattice constant of the material of the metal layer 14 and the lattice constant of magnesium oxide.

In a case where the crystal lattice of the magnesium oxide layer 15 is 45° in-plane rotated with respect to the crystal lattice of the metal layer 14, as a suitable material for the metal layer 14, a material having a lattice constant close to "½ of $2^{1/2}$ (the square root of 2) times the lattice constant of magnesium oxide" may be employed, and specifically, simple substances of the metal elements described in the upper part of Table 3 and alloys of two or more of the metal elements may be employed. In a case where the third buffer layer 16 is present and with respect to the crystal lattice of the metal layer 14, the crystal lattice of the third buffer layer 16 is not in-plane rotated and the crystal lattice of the magnesium oxide layer 15 is 45° in-plane rotated, as a suitable material for the metal layer 14, a material having a lattice constant close to "½ of $2^{1/2}$ times the lattice constant of magnesium oxide" may be employed, and specifically, simple substances of the metal elements described in the upper part of Table 3 and alloys of two or more of the metal elements may be employed. As a suitable material for the third buffer layer 16, a material in which "the lattice constant of the material of the third buffer layer 16" or "1/n (n is an integer) of the lattice constant of the material of the third buffer layer 16" is close to the lattice constant of the material of the metal layer 14 and "½ of $2^{1/2}$ times the lattice constant of magnesium oxide" may be employed, and specifically, those described in the lower part of Table 3 may be employed.

TABLE 3

| Metal layer | Crystal structure | Lattice constant [nm] | b1 = (a1 × √2)/2 [nm] (lattice constant a1 of MgO = 0.4212 nm) |
|---|---|---|---|
| V | bcc | 0.3030 | 0.2978 |
| Cr | bcc | 0.2880 | 0.2978 |
| Fe | bcc | 0.2870 | 0.2978 |
| Mo | bcc | 0.3150 | 0.2978 |
| W | bcc | 0.3160 | 0.2978 |

| Third buffer layer | Crystal structure | Lattice constant a2 [nm] | a2/2 [nm] | a2/4 [nm] |
|---|---|---|---|---|
| NiAl | bcc, CsCl | 0.2860 | | |
| CoAl | bcc, CsCl | 0.2864 | | |
| Fe | bcc | 0.2870 | | |
| Cr | bcc | 0.2880 | | |
| FeAl | bcc, CsCl | 0.2898 | | |
| TiFe | bcc, CsCl | 0.2979 | | |
| RhAl | bcc, CsCl | 0.2980 | | |
| IrAl | bcc, CsCl | 0.2985 | | |
| RuAl | bcc, CsCl | 0.2988 | | |
| TiCo | bcc, CsCl | 0.3002 | | |
| TiNi | bcc, CsCl | 0.3015 | | |
| V | bcc | 0.3030 | | |
| PdAl | bcc, CsCl | 0.3053 | | |
| TiRu | bcc, CsCl | 0.3060 | | |
| $Ti_{1.3}Ir_{0.7}$ | bcc, CsCl | 0.3106 | | |
| $Au_3Bi_7$ | bcc, simple lattice | 0.3115 | | |
| TiRh | bcc, CsCl | 0.3126 | | |
| Mo | bcc | 0.3150 | | |
| W | bcc | 0.3160 | | |
| TiPd | bcc, CsCl | 0.3180 | | |
| TaRu | bcc, CsCl | 0.3195 | | |
| $Fe_{0.75}Si_{0.25}$ | BiF3 | 0.5600 | 0.2800 | |
| $Fe_{0.75}Al_{0.25}$ | BiF3 | 0.5790 | 0.2895 | |
| $Fe_{0.75}Ga_{0.25}$ | BiF3 | 0.5807 | 0.2904 | |
| $Ti_2Co$ | $Ti_2Ni$ | 1.1288 | | 0.2822 |
| $Ti_2Ni$ | $Ti_2Ni$ | 1.1319 | | 0.2830 |
| $Ti_2Fe$ | $Ti_2Ni$ | 1.1328 | | 0.2832 |

In such cases, it is preferable that the difference between the lattice constant of the material of the metal layer 14 and "½ of $2^{1/2}$ times the lattice constant of magnesium oxide" be within 8% of "½ of $2^{1/2}$ times the lattice constant of magnesium oxide". It is preferable that the difference between "the lattice constant of the material of the third buffer layer 16" or "1/n (n is an integer) of the lattice constant of the material of the third buffer layer 16" and the lattice constant of the material of the metal layer 14 be within 8% of the lattice constant of the material of the metal layer 14. It is preferable that the difference between "the lattice constant of the material of the third buffer layer 16" or "1/n (n is an integer) of the lattice constant of the material of the third buffer layer 16" and "½ of $2^{1/2}$ times the lattice constant of magnesium oxide" be within 8% of "½ of $2^{1/2}$ times the lattice constant of magnesium oxide".

It is preferable that "the lattice constant of the material of the third buffer layer 16" or "1/n (n is an integer) of the lattice constant of the material of the third buffer layer 16" have a magnitude between the lattice constant of the material of the metal layer 14 "½ of $2^{1/2}$ times the lattice constant of magnesium oxide".

In a case where the third buffer layer 16 is present and the crystal lattice of any of the third buffer layer 16 and the magnesium oxide layer 15 is 45° in-plane rotated with respect to the crystal lattice of the metal layer 14, as a suitable material for the metal layer 14, a material having a lattice constant close to "½ of $2^{1/2}$ times the lattice constant of magnesium oxide" may be employed, and specifically, simple substances of the metal elements described in the upper part of Table 4 and alloys of two or more of the metal elements may be employed. As a suitable material for the third buffer layer 16, a material in which "1/n (n is an integer) of $2^{1/2}$ (the square root of 2) times the lattice constant of the material of the third buffer layer 16" is close to the lattice constant of the material of the metal layer 14 and "½ of $2^{1/2}$ times the lattice constant of magnesium oxide" may be employed, and specifically, those described in the lower part of Table 4 may be employed.

TABLE 4

| Metal layer | Crystal structure | Lattice constant [nm] | b1 = (a1 × √2)/2 [nm] (lattice constant a1 of MgO = 0.4212 nm) |
|---|---|---|---|
| V | bcc | 0.3030 | 0.2978 |
| Cr | bcc | 0.2880 | 0.2978 |
| Fe | bcc | 0.2870 | 0.2978 |
| Mo | bcc | 0.3150 | 0.2978 |
| W | bcc | 0.3160 | 0.2978 |

TABLE 4-continued

| Third buffer layer | Crystal structure | Lattice constant a2 [nm] | b3 = (a2 × √2)/2 [nm] | b4 = (a2 × √2)/4 [nm] |
|---|---|---|---|---|
| Ag | fcc | 0.4090 | 0.2892 | |
| $Ag_{0.06}Pt_{0.94}$ | Cu | 0.3929 | 0.2778 | |
| $Ag_{0.5}Au_{0.5}$ | Cu | 0.4077 | 0.2883 | |
| $Ag_{0.5}Cu_{0.5}$ | Cu | 0.3877 | 0.2741 | |
| $Ag_{0.5}Fe_{0.5}$ | Cu | 0.4030 | 0.2850 | |
| $Ag_{0.5}Ni_{0.5}$ | Cu | 0.3830 | 0.2708 | |
| $Ag_{0.5}Pd_{0.5}$ | Cu | 0.3911 | 0.2765 | |
| $Ag_{0.5}Pt_{0.5}$ | Cu | 0.3980 | 0.2814 | |
| $Ag_{0.65}Li_{0.35}$ | Cu | 0.4042 | 0.2858 | |
| $Ag_{0.67}Pt_{0.33}$ | Cu | 0.4004 | 0.2831 | |
| $Ag_{0.79}Al_{0.21}$ | Cu | 0.4065 | 0.2874 | |
| $Ag_{0.84}Ga_{0.16}$ | Cu | 0.4072 | 0.2879 | |
| $Ag_{0.84}Ge_{0.16}$ | Cu | 0.4090 | 0.2892 | |
| $Ag_{0.84}Mn_{0.16}$ | Cu | 0.4085 | 0.2889 | |
| $Ag_{0.91}Pt_{0.09}$ | Cu | 0.4058 | 0.2869 | |
| $Ag_{0.935}Er_{0.065}$ | Cu | 0.4099 | 0.2899 | |
| $Ag_{0.93}As_{0.07}$ | Cu | 0.4097 | 0.2897 | |
| $Ag_{0.95}Dy_{0.05}$ | Cu | 0.4091 | 0.2893 | |
| $Ag_{0.95}Gd_{0.05}$ | Cu | 0.4096 | 0.2896 | |
| $Ag_{0.95}Tb_{0.05}$ | Cu | 0.4097 | 0.2897 | |
| $Ag_{0.975}Pr_{0.025}$ | Cu | 0.4087 | 0.2890 | |
| $Ag_{0.97}Cu_{0.03}$ | Cu | 0.4088 | 0.2890 | |
| $Ag_{0.97}Nd_{0.03}$ | Cu | 0.4087 | 0.2890 | |
| $Ag_{0.98}Ce_{0.02}$ | Cu | 0.4087 | 0.2890 | |
| $Ag_{0.68}Y_{0.02}$ | Cu | 0.4092 | 0.2893 | |
| $Ag_{0.9975}Eu_{0.0025}$ | Cu | 0.4089 | 0.2891 | |
| $Ag_{0.9975}Sm_{0.0025}$ | Cu | 0.4087 | 0.2890 | |
| $Ag_{0.99}La_{0.01}$ | Cu | 0.4086 | 0.2890 | |
| $Ag_{0.99}Yb_{0.01}$ | Cu | 0.4088 | 0.2891 | |
| Al | fcc | 0.4050 | 0.2864 | |
| Au | fcc | 0.4080 | 0.2885 | |
| $Au_{0.5}Fe_{0.5}$ | Cu | 0.3946 | 0.2790 | |
| $Fe_{0.1}Al_{0.9}$ | Cu | 0.4040 | 0.2857 | |
| $Fe_{0.5}O_{0.5}$ | NaCl | 0.4311 | 0.3048 | |
| $Mo_{0.73}Fe_{0.27}$ | Cu | 0.3860 | 0.2729 | |
| $Au_2Bi$ | MgCu2 | 0.7942 | | 0.2808 |
| $YAl_2$ | MgCu2 | 0.7855 | | 0.2777 |
| NiO | NaCl | 0.4190 | 0.2963 | |
| $SrTiO_3$, $Sr(Ti,Nb)O_3$ | perovskite | 0.3905 | 0.2761 | |
| $SrRuO_3$ | perovskite | 0.3950 | 0.2793 | |
| PZT | perovskite | 0.4036 | 0.2854 | |
| PLZT | perovskite | 0.4080 | 0.2885 | |

In this case, it is preferable that the difference between the lattice constant of the material of the metal layer 14 and "½ of $2^{1/2}$ times the lattice constant of magnesium oxide" be within 8% of "½ of $2^{1/2}$ times the lattice constant of magnesium oxide". It is preferable that the difference between "1/n (n is an integer) of $2^{1/2}$ times the lattice constant of the material of the third buffer layer 16" and the lattice constant of the material of the metal layer 14 be within 8% of the lattice constant of the material of the metal layer 14. It is preferable that the difference between "1/n (n is an integer) of $2^{1/2}$ times the lattice constant of the material of the third buffer layer 16" and "½ of $2^{1/2}$ times the lattice constant of magnesium oxide" be within 8% of "½ of $2^{1/2}$ times the lattice constant of magnesium oxide". It is preferable that "1/n (n is an integer) of $2^{1/2}$ times the lattice constant of the material of the third buffer layer 16" have a magnitude between the lattice constant of the material of the metal layer 14 and "½ of $2^{1/2}$ times the lattice constant of magnesium oxide".

In the laminate 10 or 10A according to the embodiment, the metal layer 14 on the lower layer side of the magnesium oxide layer 15 is substantially made of at least one among platinum, iridium, palladium, rhodium, vanadium, chromium, iron, molybdenum, tungsten, aluminum, silver, gold, copper, and nickel. Any of these materials has a similar cubic structure to that of magnesium oxide and has a high lattice matching rate with the magnesium oxide layer 15, so that the magnesium oxide layer 15 formed on the metal layer 14 is grown in succession to the C-axis orientation of the metal layer 14. As a result, the formed magnesium oxide layer 15 has crystallinity equivalent to that of the single crystal substrate of magnesium oxide.

In the laminate 10 or 10A according to the embodiment, the material of the substrate 11 is not limited, and for example, even when an inexpensive substrate compared to the single crystal substrate of magnesium oxide is used, a magnesium oxide thin film (the magnesium oxide layer 15) having crystallinity equivalent to that of the single crystal substrate is formed on the surface thereof. Therefore, by using the laminate 10 or 10A, it is possible to manufacture a device such as a thermoelectric conversion element having a thin-film-crystallized layer at a lower cost than in a case of using a single crystal substrate of magnesium oxide.

By applying the laminate 10 or 10A as a base material, various devices such as a thermoelectric conversion element, a magnetic tunnel junction element, and a superconducting element can be formed. Representative application examples are listed below.

APPLICATION EXAMPLE 1

Magnetic Tunnel Junction Element

Figure 2:
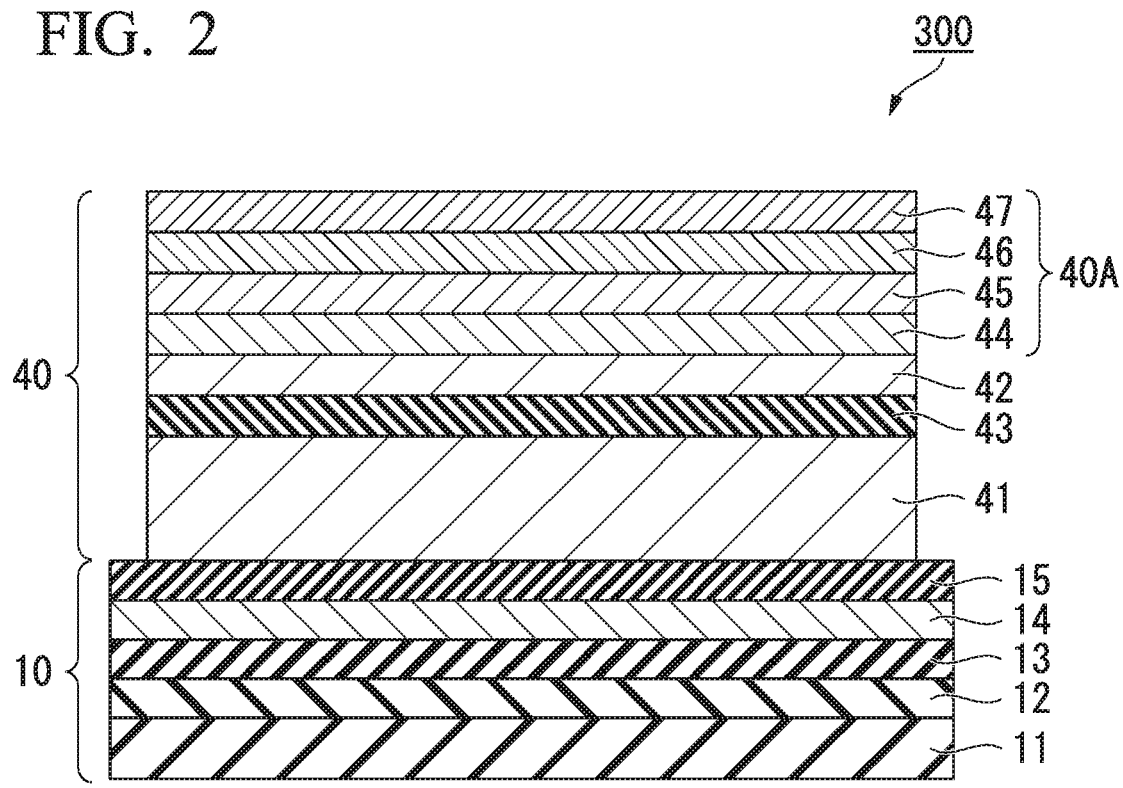
FIG. 2 is a sectional view of a magnetic tunnel junction element according to Application Example 1 of the laminate of the disclosure.

FIG. 2 is a sectional view schematically illustrating a configuration of a magnetic tunnel junction (MTJ) element 300 in which the above-described laminate 10 is formed as a base material as Application Example 1 of the laminate of the disclosure. The magnetic tunnel junction element 300 is constituted by the laminate 10 and a laminated film 40 including a Heusler layer having a Heusler alloy type crystal structure mounted on the laminate 10.

In the laminated film 40, a magnetic layer 41 and a magnetic layer 42 having a Heusler alloy type crystal structure are bonded with an insulating layer 43 interposed therebetween, and a metal layer 40A is formed on the magnetic layer 42 on the upper layer side. As the material of the magnetic layer 41 and the magnetic layer 42, for example, $Co_2MnSi$ is used. As the material of the insulating layer 43, for example, magnesium oxide is used. The thicknesses of the magnetic layer 41, the magnetic layer 42, and the insulating layer 43 are about 50 nm, about 5 nm, and about 2 to 3 nm, respectively.

As the material of the magnetic layers 41 and 42, a material of which the crystal structure is represented by $Co_2AB$ is used.

The element of A can be selected from Cr, Mn, V, and Fe, or a combination of two or more of these elements. The element of B can be selected from Al, Si, Ga, Ge, In, and Sn, or a combination of two or more of these elements. Specific examples thereof include $Co_2MnAl$, $Co_2MnSi$, $Co_2MnGa$, $Co_2MnGe$, $Co_2MnGaGe$, $Co_2MnGaSn$, $Co_2MnSn$, $Co_2FeAl$, $Co_2FeSi$, $Co_2FeGa$, $Co_2FeGe$, $Co_2FeGaGe$, $Co_2CrAl$, and $Co_2VAl$.

In the metal layer 40A, a ruthenium layer 44 (about 0.8 nm in thickness), a cobalt iron layer 45 (about 2 nm in thickness) represented by $Co_{90}Fe_{10}$, an iridium manganese layer 46 (about 10 nm in thickness), and a ruthenium layer 47 (about 5 nm) are laminated in this order from the lower layer side toward the upper layer side.

Since the magnesium oxide layer 15 as the underlayer has crystallinity equal to that of the single crystal substrate, the magnetic tunnel junction element epitaxially grown on the magnesium oxide layer 15 has superior properties.

APPLICATION EXAMPLE 2

Magnetic Tunnel Junction Element

Figure 3:
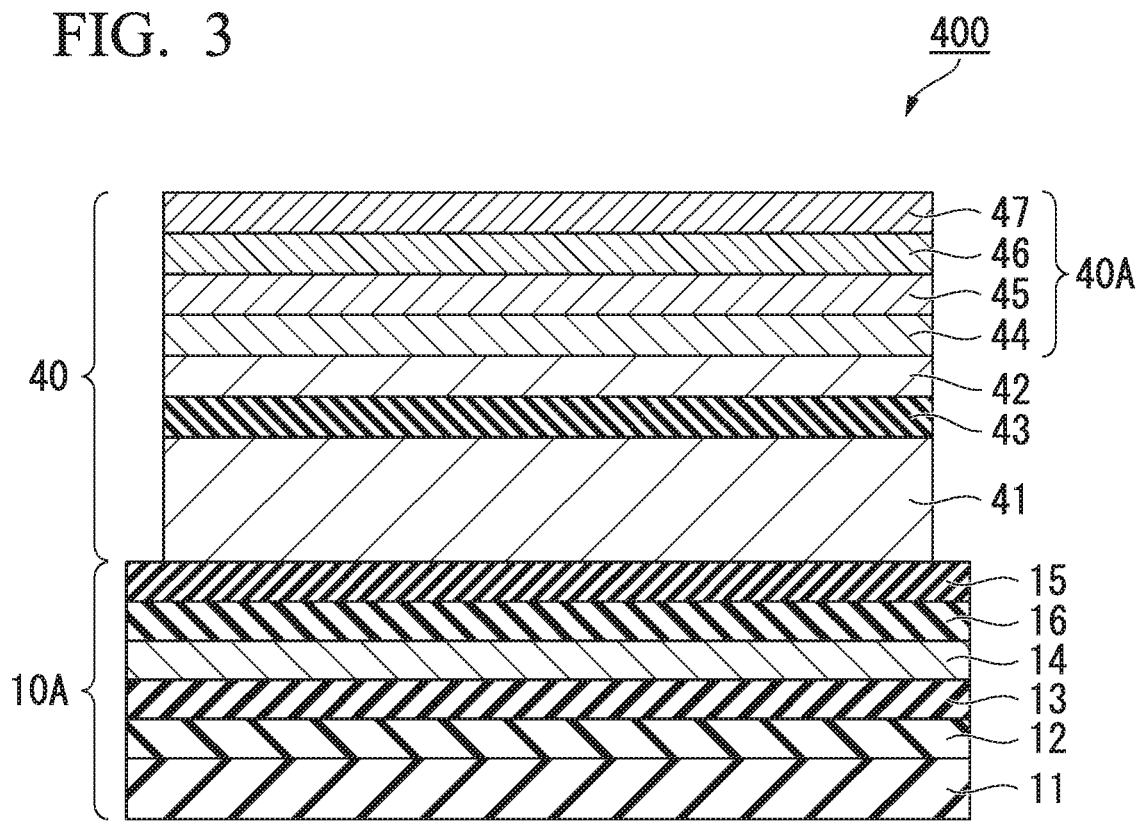
FIG. 3 is a sectional view of a magnetic tunnel junction element according to Application Example 2 of the laminate of the disclosure.

FIG. 3 is a sectional view schematically showing a configuration of a magnetic tunnel junction (MTJ) element 400 in which the above-described laminate 10A is formed as a base material as Application Example 2 of the laminate of the disclosure. The magnetic tunnel junction element 400 has the same configuration as that of the magnetic tunnel junction element 300 of Application Example 3 except that the third buffer layer 16 is provided between the metal layer 14 and the magnesium oxide layer 15 included in the base material (laminate).

APPLICATION EXAMPLE 3

Superconducting Element

Figure 4:
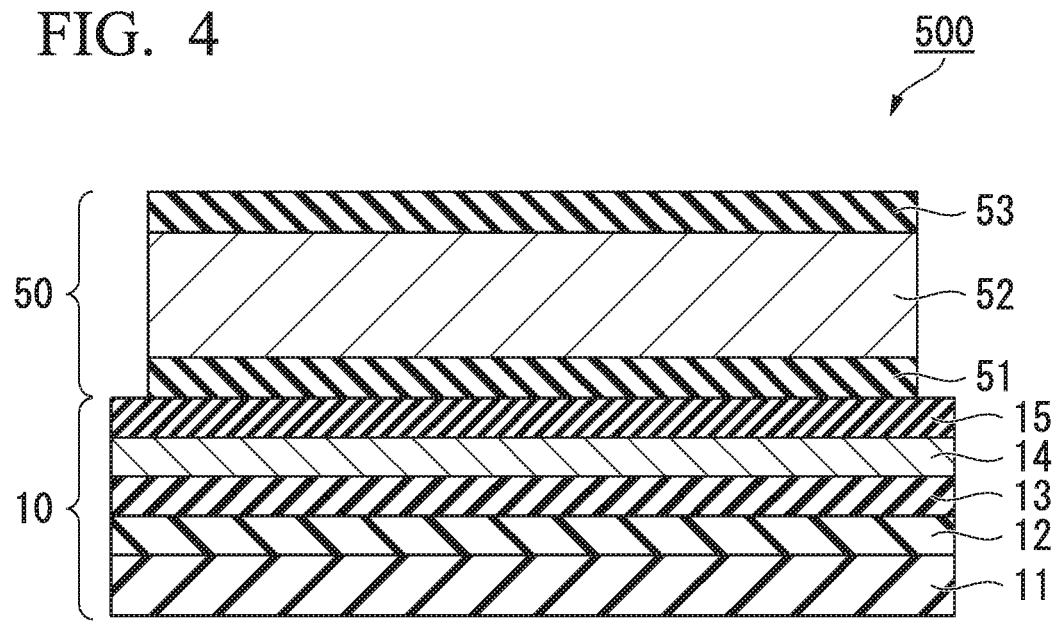
FIG. 4 is a sectional view of a superconducting element according to Application Example 3 of the laminate of the disclosure.

FIG. 4 is a sectional view schematically illustrating a configuration of a superconducting element 500 in which the above-described laminate 10 is formed as a base material as Application Example 3 of the disclosure. The superconducting element 500 is constituted by the laminate 10 and a laminated film 50 mounted on the laminate 10 and has an intermediate layer 51, a superconducting layer 52, and a stabilizing layer 53. An example in which the above-described laminate 10 is used as the base material of the superconducting element 500 is described, but the above-described laminate 10A may also be used.

As the material of the intermediate layer 51, stabilized zirconia (YSZ), nickel oxide (NiO), cerium oxide ($CeO_2$), or the like is used. The superconducting layer 52 has an oxygen-deficient three-layer perovskite structure. As the material of the superconducting layer 52, a material denoted by $YBa_2Cu_3O_x$ or $GdBa_2Cu_3O_x$ is used. By forming a tetragonal crystal by adjusting the oxygen content represented by x, the superconducting layer 52 can be formed on the laminate 10 or 10A. As the material of the stabilizing layer 53, silver or the like is used.

Even in a case where the material of the superconducting layer 52 is a Bi-based copper oxide superconductor represented by $Bi_{1.7}Sr_{1.6}Cu_7O_x$, which is a deformed perovskite structure, the superconducting layer 52 can also be formed on the laminate 10 or 10A as long as the basic structure thereof is tetragonal.

Since the magnesium oxide layer as the underlayer has crystallinity equal to that of the single crystal substrate, the superconducting element epitaxially grown on the magnesium oxide layer has superior properties.

APPLICATION EXAMPLE 4

Ferroelectric Element

On the laminate 10 or 10A according to the embodiment, a ferroelectric film represented by $ABO_3$ such as $Pb(Zr,Ti)O_3$ (PZT, lead zirconate titanate) or the like and which has a cubic or tetragonal perovskite crystal structure can also be formed. As the material of the ferroelectric film, in addition to PZT mentioned above, a Pb-based perovskite compound such as $(Pb,La)(Zr,Ti)O_3$ (PLZT), $CaTiO_3$, $BaTiO_3$, $PbTiO_3$, $KTaO_3$, $BiFeO_3$, $NaTaO_3$, $SrTiO_3$, $CdTiO_3$, $KNbO_3$, $LiNbO_3$, $LiTaO_3$, or the like can be used.

[Thermoelectric Conversion Element]

Figure 5:
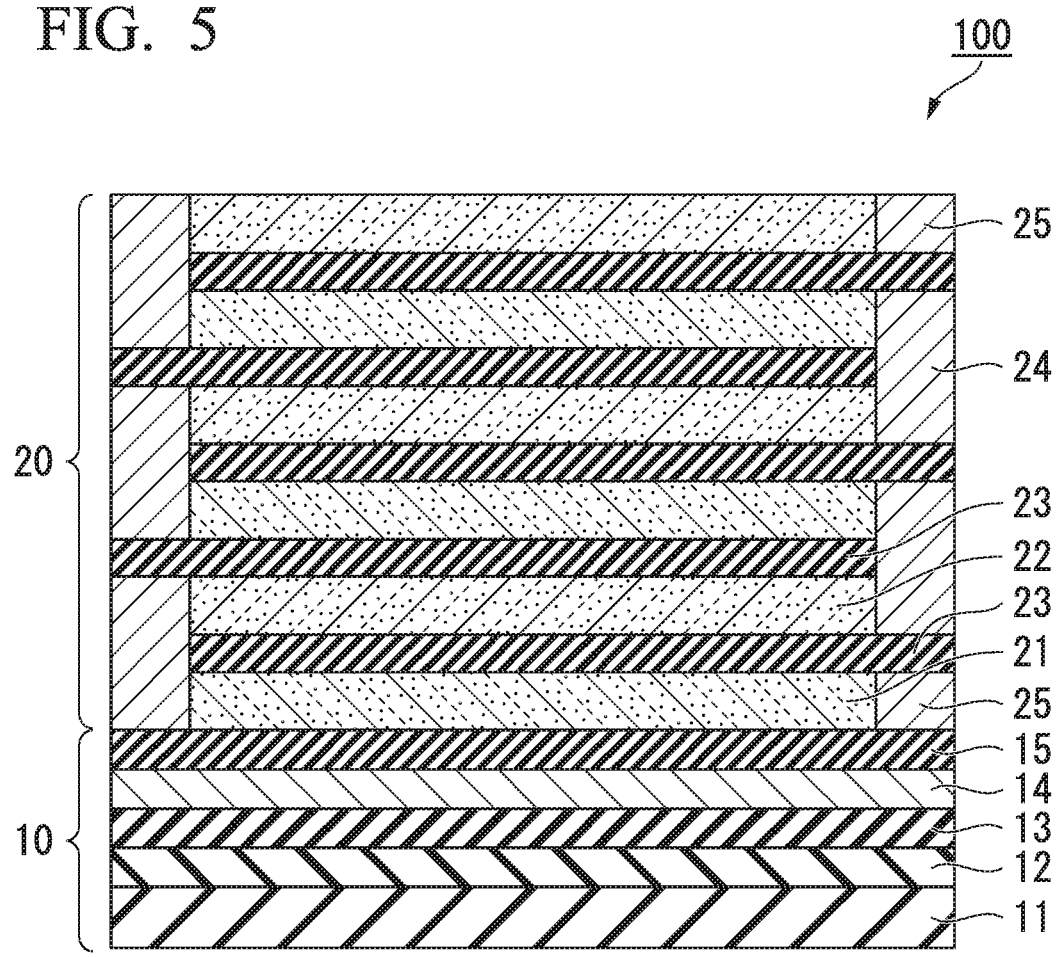
FIG. 5 is a sectional view of a thermoelectric conversion element according to the embodiment of the laminate of the disclosure.

FIG. 5 is a sectional view schematically illustrating a configuration of a thermoelectric conversion element 100 according to the embodiment of the disclosure. The thermoelectric conversion element 100 includes the laminate 10 and a laminated film 20 including a Heusler layer having a Heusler alloy type crystal structure mounted on the laminate 10. The laminated film 20 includes a Heusler layer 21 made of an n-type semiconductor film having a Heusler alloy type crystal structure, a Heusler layer 22 made of a p-type semiconductor film having a Heusler alloy type crystal structure, and a first insulating layer 23 disposed therebetween. In the laminated film 20, the Heusler layer 21 and the Heusler layer 22 are alternately and repeatedly laminated with the first insulating layer 23 interposed therebetween.

The first insulating layer 23 is substantially made of magnesium oxide, nickel oxide, or strontium titanate. That is, although the first insulating layer 23 contains any of magnesium oxide, nickel oxide, and strontium titanate as a primary component, the composition thereof may deviate from the stoichiometric composition within a range that does not influence the effects of the disclosure and may contain a small amount of impurities.

The Heusler layer 21 and the Heusler layer 22 adjacent to each other are connected via a through-electrode 24. In the laminated film 20, each of a semiconductor film positioned in the uppermost layer and a semiconductor film positioned in the lowermost layer is provided with a lead-out electrode 25. An example in which the above-described laminate 10 is used as the base material of the thermoelectric conversion element 100 is described, but the above-described laminate 10A may also be used.

Since a plurality of the Heusler layers 21 and the Heusler layers 22 are laminated with the first insulating layers 23 interposed therebetween, the effects of the thermoelectric conversion element such as a high degree of integration, miniaturization, and an improvement in the thermoelectric generation amount can be enhanced.

As the Heusler alloy type crystal structure of the Heusler layer 21 and the Heusler layer 22, a full-Heusler alloy type structure denoted by $A_2EG$ and a half-Heusler alloy type structure denoted by AEG are known. A and E are transition metal elements, and G is a semiconductor element or a nonmagnetic metal element.

The material of A can be selected from iron, cobalt, nickel, copper, zinc, radon, rhodium, palladium, silver, cadmium, iridium, platinum, and gold. The material of E can be selected from titanium, vanadium, chromium, manganese, yttrium, zirconium, niobium, hafnium, and tantalum. The material of G can be selected from aluminum, silicon, gallium, germanium, arsenic, indium, tin, antimony, titanium, palladium, and bismuth. In a case where the crystal structure of the semiconductor film is the full-Heusler alloy type structure, suitable examples for the Heusler layer 22 include iron vanadium aluminum ($Fe_2VAl$), suitable examples for the Heusler layer 21 include $Fe_{1.92}V_{1.08}Al$ in which the ratio of vanadium to iron is higher than that of iron vanadium aluminum.

In a case where the crystal structure of the semiconductor film is the half-Heusler alloy type structure, suitable examples for the Heusler layer 22 include TiCoSb, ZrCoSb, and HfCoSb, and suitable examples for the Heusler layer 21 include TiNiSn, ZrNiSn, and HfNiSn.

Since the magnesium oxide layer as the underlayer has crystallinity equal to that of the single crystal substrate, the functional portion of the thermoelectric conversion element epitaxially grown on the magnesium oxide layer has superior properties.

The composition of the Heusler layer is represented by $A_xEG$, and in a case of x≥2, the full-Heusler alloy structure can be easily maintained, and thus crystallinity can be improved.

[Thermoelectric Conversion Element]

Figure 6:
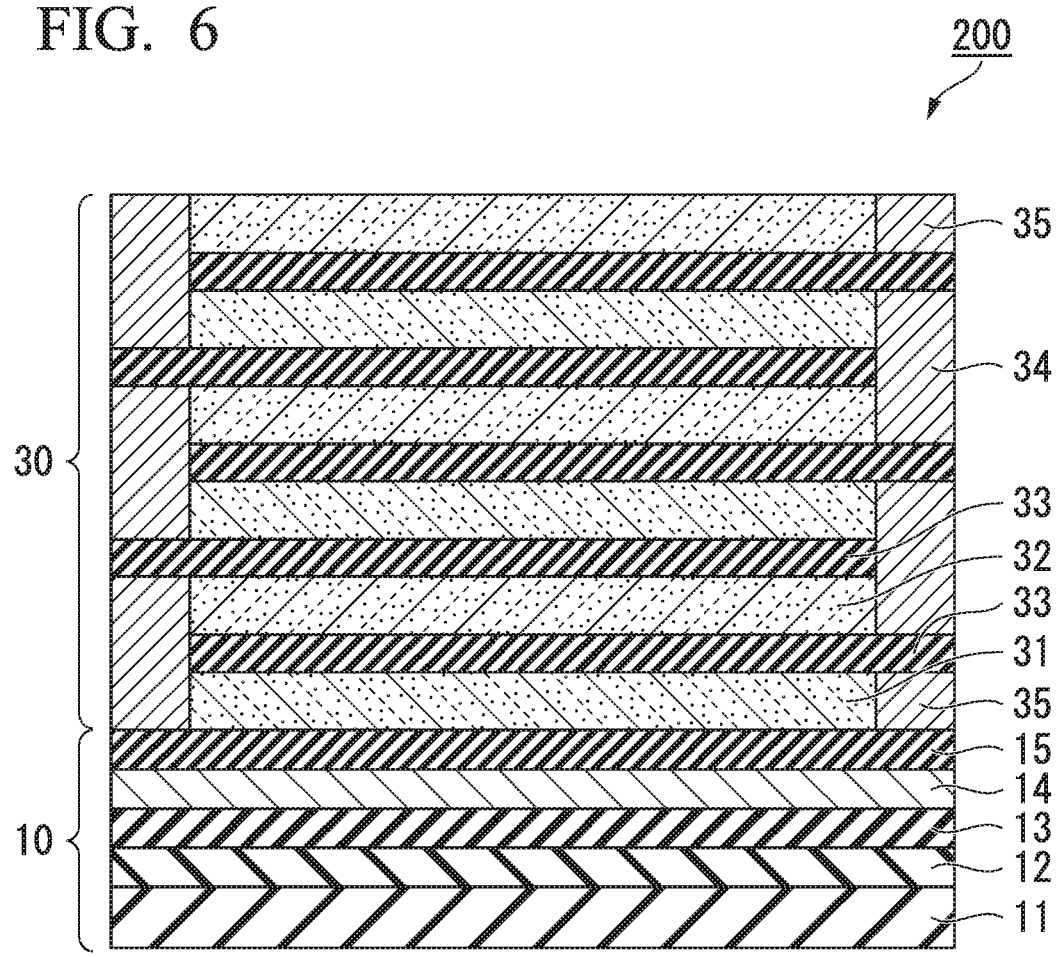
FIG. 6 is a sectional view of a thermoelectric conversion element according to the embodiment of the laminate of the disclosure.

FIG. 6 is a sectional view schematically illustrating a configuration of a thermoelectric conversion element 200 according to another embodiment of the disclosure. The thermoelectric conversion element 200 includes a laminate 10 and a laminated film 30 mounted on the laminate 10, and included a perovskite layer 31 having a perovskite crystal structure, a Heusler layer 32 having a Heusler alloy type crystal structure, and a second insulating layer 33 disposed therebetween. The Heusler layer 32 is a p-type semiconductor, and the perovskite layer 31 is an n-type semiconductor.

The second insulating layer 33 is substantially made of magnesium oxide, nickel oxide, or strontium titanate. That is, although the second insulating layer 33 contains any of magnesium oxide, nickel oxide, and strontium titanate as a primary component, the composition thereof may deviate from the stoichiometric composition within a range that does not influence the effects of the disclosure and may contain a small amount of impurities.

FIG. 6 illustrates the case where the laminated film 30 has the perovskite layer 31, the second insulating layer 33, and the Heusler layer 32 in this order on the laminate 10. The positions of the perovskite layer 31 and the position of the Heusler layer 32 may be interchanged. However, since the perovskite crystal structure has good compatibility with magnesium oxide, it is more preferable that the laminated film 30 have, in order from the laminate 10 side, the perovskite layer 31, the second insulating layer 33, and the Heusler layer 32 from the viewpoint of enhancing the crystallinity of the perovskite layer 31.

The n-type semiconductor represented by $R(M_x,D_y)O_3$ or $(R_x,D_y)MO_3$ can be obtained by doping a perovskite type compound represented by the general formula $RMO_3$ with an element D having a higher valence than the valence of the element R or the valence of the element M. Considering the compatibility of the perovskite layer 31 with the lattice constant of the magnesium oxide layer, R is preferably selected from barium, calcium, iron, potassium, lanthanum, lithium, magnesium, manganese, sodium, strontium, and zinc, and M is preferably selected from cobalt, iron, hafnium, lanthanum, manganese, niobium, nickel, silicon, tin, tantalum, titanium, and zirconium.

Suitable examples for the perovskite layer 31 include niobium doped strontium titanate $(Sr(Ti,Nb)O_3)$, and calcium manganate $(CaMnO_3)$. Calcium manganate functions as an n-type semiconductor even when not doped with the element D but may also be doped with zinc as the element D.

The perovskite layer 31 and the Heusler layer 32 adjacent to each other are connected via a through-electrode 34. In the laminated film 30, each of a semiconductor film positioned in the uppermost layer and a semiconductor film positioned in the lowermost layer is provided with a lead-out electrode 35. An example in which the above-described laminate 10 is used as the base material of the thermoelectric conversion element 200 is described, but the above-described laminate 10A may also be used.

The composition of the Heusler layer is represented by $A_xEG$, and in a case of x≥2, the full-Heusler alloy structure can be easily maintained, and thus crystallinity can be improved.

In the laminate of the embodiment, the metal layer on the lower layer side of the magnesium oxide layer is substantially made of at least one among platinum, iridium, palladium, rhodium, vanadium, chromium, iron, molybdenum, tungsten, aluminum, silver, gold, copper, and nickel. Any of these materials has a similar cubic structure to that of magnesium oxide and has a high lattice matching rate with the magnesium oxide layer, so that the magnesium oxide layer formed on the metal layer is grown in succession to the C-axis orientation of the metal layer. As a result, the formed magnesium oxide layer has crystallinity equivalent to that of a single crystal substrate of magnesium oxide.

In the laminate of the embodiment, the material of the substrate is not limited, and for example, even when an inexpensive substrate compared to the single crystal substrate of magnesium oxide is used, a magnesium oxide thin film having crystallinity equivalent to that of the single crystal substrate is formed on the surface thereof. Therefore, by using the laminate of the embodiment, it is possible to manufacture a device such as a thermoelectric conversion element having a thin-film-crystallized layer at a lower cost than in a case of using a single crystal substrate of magnesium oxide.

EXAMPLES

Hereinafter, the effects of the disclosure will be clarified by examples. The present invention is not limited to the following examples and can be carried out with appropriate modifications within a scope that does not change the gist thereof.

Example 1

On a Si(100) single crystal substrate 11, a first buffer layer 12 made of zirconia $(ZrO_2)$, a second buffer layer 13 made of yttria $(Y_2O_3)$, a metal layer 14 made of Pt, and a first magnesium oxide layer 15 were formed by the following procedure.

First, a disk-shaped Si single crystal substrate (wafer) 11 having a diameter of 3 inches and a thickness of 400 μm was prepared by cutting the surface so as to become a (100) plane and performing mirror polishing thereon. The surface of the substrate 11 was etched and cleaned with a 40% ammonium fluoride aqueous solution.

Next, a vapor deposition apparatus was used, and the vacuum chamber of the vapor deposition apparatus was evacuated to $10^{-6}$ Torr. After the evacuation, the substrate 11 was rotated at 20 rpm and heated to 900° C. To stabilize the substrate temperature, a substrate stabilization time of 5 minutes or longer once the set temperature was reached was allowed.

Next, a thin film of zirconia $(ZrO_2)$ as the first buffer layer 12 was formed. While introducing oxygen from the vicinity of the substrate at a rate of 10 cc/min, the metal Zr vaporized in a vaporization unit was supplied to the surface of the substrate 11 to form a thin film. The amount of metal Zr supplied was adjusted so that the thickness of the zirconia thin film became 20 nm.

Next, a thin film of yttria $(Y_2O_3)$ as the second buffer layer 13 was formed. While introducing oxygen from the vicinity of the substrate at a rate of 10 cc/min, the metal Y vaporized in a vaporization unit was supplied to the surface of the substrate to form a thin film. The amount of yttria supplied was adjusted so that the thickness of the yttria thin film became 50 nm.

A diffraction image of the outermost surface of the yttria thin film observed by reflection high-speed electron beam diffraction was in a sharp spot shape. From this, it could be seen that the yttria thin film is an epitaxial film with good crystallinity.

Next, a metal layer (Pt thin film) 14 made of platinum (Pt) with a thickness of 100 nm was formed on the yttria thin film. This film formation was performed by a parallel plate type RF magnetron sputtering method. The substrate 11 was heated to 600° C. to 700° C. and argon gas was introduced. The half-width FWHM of the rocking curve of the Pt(200) reflection of the metal layer 14 was 0.207°. From this, it can be seen that the metal layer 14 is an epitaxial film with good crystallinity.

Next, a magnesium oxide layer was formed on this metal layer 14 so as to have a thickness of 50 nm. This film formation was performed by a PLD (pulse laser ablation) film formation method. Heating was then performed to raise the substrate temperature to 500° C. to 800° C. and oxygen was introduced at a rate of 10 cc/min.

Figure 7:
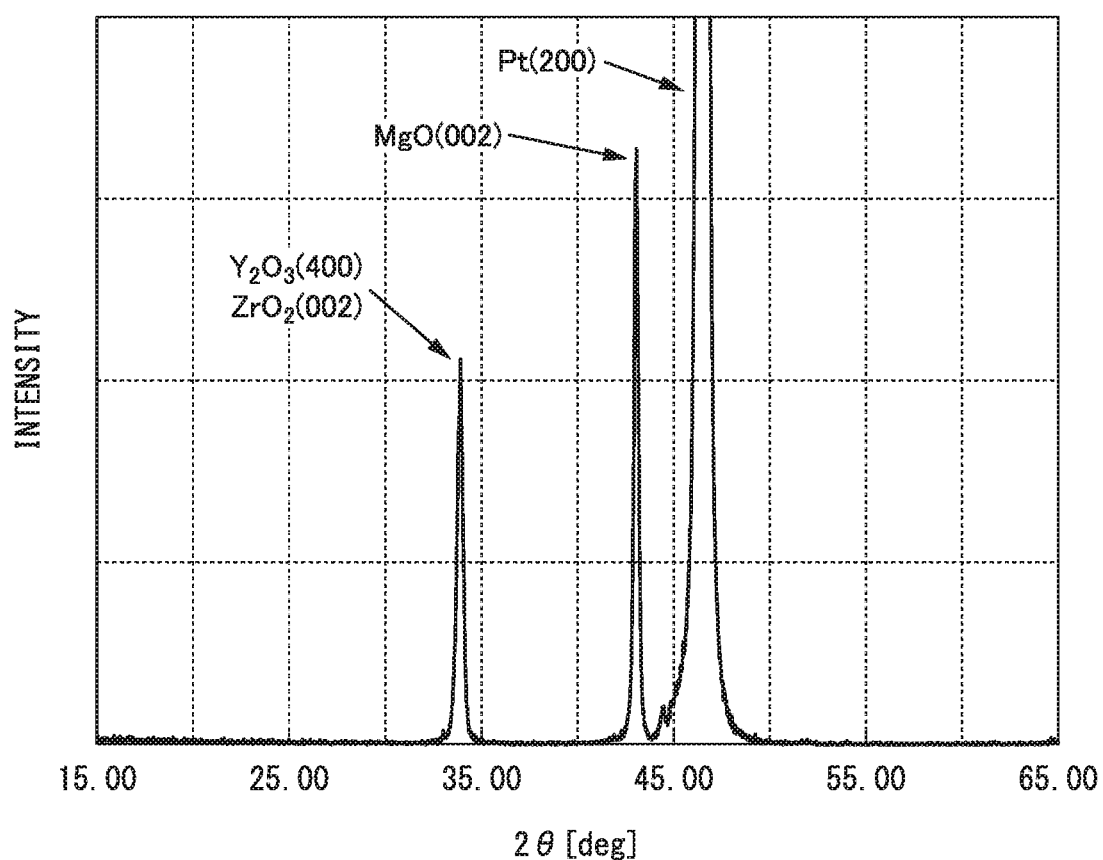
FIG. 7 is a graph showing an analysis result of X-ray diffraction of a laminate according to Example 1 of the disclosure.

X-ray diffraction analysis was performed on the first buffer layer ($ZrO_2$) 12, the second buffer layer ($Y_2O_3$) 13, the metal layer (Pt) 14, and the magnesium oxide layer 15 on the single crystal Si substrate 11. The results are shown in the graph of FIG. 7.

The magnesium oxide layer 15 was formed in a single orientation, and the half-width FWHM of the rocking curve of the MgO(002) reflection of the magnesium oxide layer 15 was 0.387°. From this, it can be seen that the magnesium oxide layer 15 is an epitaxial film with good crystallinity.

In Example 1, the difference between the lattice constant of platinum as the material of the metal layer 14 and the lattice constant of magnesium oxide is about 6.9% of the lattice constant of magnesium oxide.

Example 2

A first buffer layer ($ZrO_2$) 12, a second buffer layer ($Y_2O_3$) 13, and a metal layer (Pt) 14 were formed on a single crystal Si substrate 11 in the same procedure as in Example 1. The half-width FWHM of the rocking curve of the Pt(200) reflection forming the metal layer 14 was 0.219°. From this, it can be seen that the metal layer 14 is an epitaxial film with good crystallinity.

Next, a third buffer layer 16 made of strontium titanate ($SrTiO_3$) having a thickness of 50 nm was formed on the metal layer 14. This film formation was performed by a parallel plate type RF magnetron sputtering method. The substrate was then heated to 600° C. to 700° C. and Ar and $O_2$ gas was introduced. The partial pressure of $O_2$ of the gas was 10% of Ar.

The half-width FWHM of the rocking curve of the $SrTiO_3$(002) reflection forming the third buffer layer 16 was 0.243°. From this, it can be seen that the third buffer layer 16 made of $SrTiO_3$ is an epitaxial film with good crystallinity.

Next, a magnesium oxide layer 15 was formed on the third buffer layer 16 so as to have a thickness of 50 nm. This film formation was performed in the same manner as in Example 1.

Figure 8:
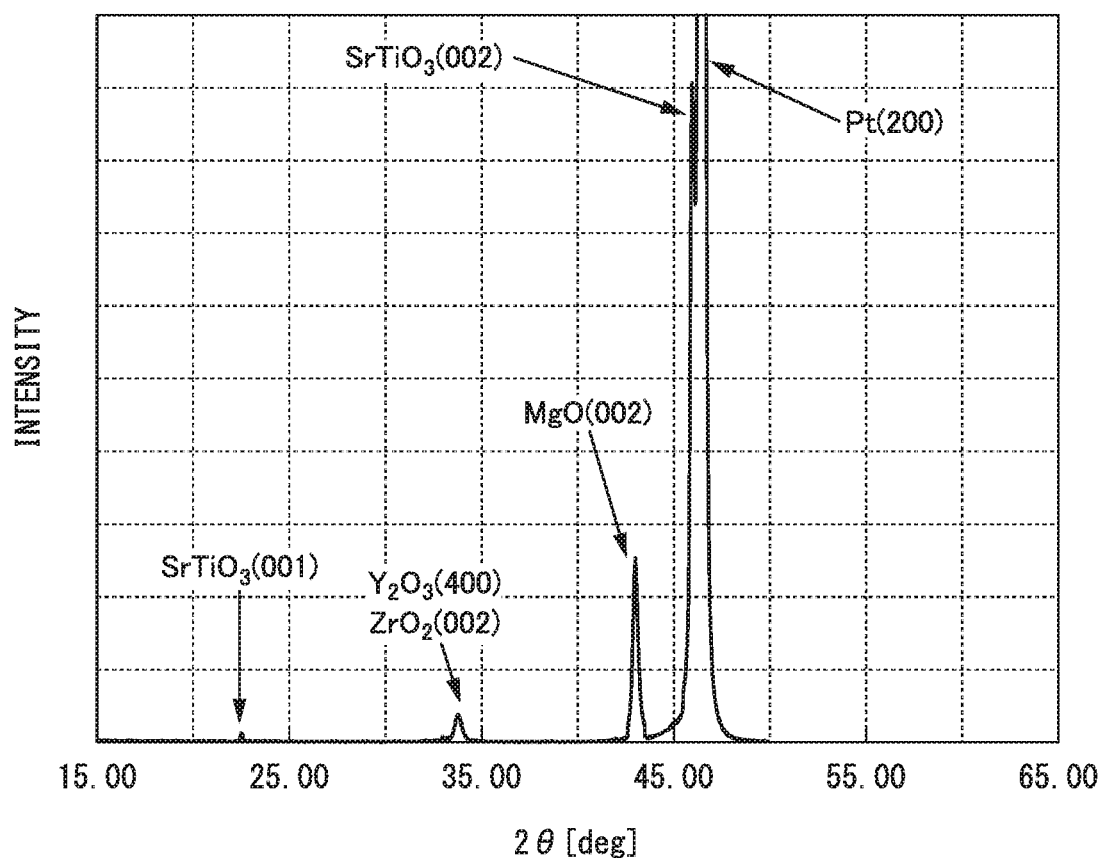
FIG. 8 is a graph showing an analysis result of X-ray diffraction of a laminate according to Example 2 of the disclosure.

X-ray diffraction analysis was performed on the first buffer layer ($ZrO_2$) 12, the second buffer layer ($Y_2O_3$) 13, the metal layer (Pt) 14, the third buffer layer ($SrTiO_3$) 16, and the magnesium oxide layer 15 on the single crystal Si substrate 11. The results are shown in the graph of FIG. 8.

The magnesium oxide layer 15 was formed in a single orientation, and the half-width FWHM of the rocking curve of the MgO(002) reflection of the magnesium oxide layer 15 was 0.254°. From this, it can be seen that the magnesium oxide layer 15 is an epitaxial film with higher crystallinity than in Example 1.

In Example 2, the difference between the lattice constant of platinum as the material of the metal layer 14 and the lattice constant of magnesium oxide is about 6.9% of the lattice constant of magnesium oxide, the difference between the lattice constant of strontium titanate as the material of the third buffer layer 16 and the lattice constant of platinum as the material of the metal layer 14 is about 0.5% of the lattice constant of platinum as the material of the metal layer 14, and the difference between the lattice constant of strontium titanate as the material of the third buffer layer 16 and the lattice constant of magnesium oxide is about 7.3% of the lattice constant of magnesium oxide.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the disclosure. Accordingly, the invention is not to be considered as being limited by the foregoing description, and is only limited by the scope of the appended claims.

What is claimed is:

1. A laminate, comprising:
   on a substrate,
   a first buffer layer substantially made of zirconium oxide or stabilized zirconia;
   a second buffer layer substantially made of yttrium oxide;
   a metal layer substantially made of at least one among platinum, iridium, palladium, rhodium, vanadium, chromium, iron, molybdenum, tungsten, aluminum, silver, gold, copper, and nickel; and
   a magnesium oxide layer substantially made of magnesium oxide, in this order.

2. The laminate according to claim 1, further comprising:
   a third buffer layer between the metal layer and the magnesium oxide layer.

3. The laminate according to claim 2,
   wherein the third buffer layer is substantially made of at least one among: nickel oxide, strontium titanate, niobium doped strontium titanate, strontium ruthenate, lead lanthanum zirconate titanate, lead zirconate titanate, vanadium, chromium, iron, molybdenum, tungsten, aluminum, silver, gold, iron aluminum, yttrium aluminum, cobalt aluminum, nickel aluminum, ruthenium aluminum, rhodium aluminum, palladium aluminum, iridium aluminum, yttrium copper, gold bismuth, iron titanium, titanium cobalt, titanium nickel, titanium rhodium, titanium palladium, titanium iridium, and tantalum ruthenium; an alloy as a binary alloy of silver and X, X being any of aluminum, manganese, copper, gallium, germanium, arsenic, yttrium, lanthanum, cerium, praseodymium, neodymium, samarium, europium, gadolinium, terbium, dysprosium, erbium, ytterbium, and platinum; an alloy as a binary alloy of iron and Y, Y being any of aluminum, silicon, gallium, molybdenum, silver, and gold; and an alloy as a ternary alloy of nickel, aluminum, and Z, Z being any of silicon, scandium, titanium, chromium, manganese, iron, cobalt, copper, zirconium, niobium, and tantalum.

4. A thermoelectric conversion element, comprising:
a laminated film including a Heusler layer having a Heusler alloy type crystal structure on the laminate according to claim 1.

5. A thermoelectric conversion element, comprising:
a laminated film including a Heusler layer having a Heusler alloy type crystal structure on the laminate according to claim 2.

6. A thermoelectric conversion element, comprising:
a laminated film including a Heusler layer having a Heusler alloy type crystal structure on the laminate according to claim 3.

7. The thermoelectric conversion element according to claim 4,
wherein the laminated film includes an n-type semiconductor film and a p-type semiconductor film, both of which have the Heusler alloy type crystal structure as the Heusler layer, and further includes a first insulating layer disposed between the n-type and p-type semiconductor films.

8. The thermoelectric conversion element according to claim 5,
wherein the laminated film includes an n-type semiconductor film and a p-type semiconductor film, both of which have the Heusler alloy type crystal structure as the Heusler layer, and further includes a first insulating layer disposed between the n-type and p-type semiconductor films.

9. The thermoelectric conversion element according to claim 6,
wherein the laminated film includes an n-type semiconductor film and a p-type semiconductor film, both of which have the Heusler alloy type crystal structure as the Heusler layer, and further includes a first insulating layer disposed between the n-type and p-type semiconductor films.

10. The thermoelectric conversion element according to claim 4,
wherein the laminated film further includes a perovskite layer having a perovskite crystal structure, and a second insulating layer disposed between the Heusler layer and the perovskite layer, the second insulating layer being in contact with both of the Heusler layer and the perovskite layer.

11. The thermoelectric conversion element according to claim 5,
wherein the laminated film further includes a perovskite layer having a perovskite crystal structure, and a second insulating layer disposed between the Heusler layer and the perovskite layer, the second insulating layer being in contact with both of the Heusler layer and the perovskite layer.

12. The thermoelectric conversion element according to claim 6,
wherein the laminated film further includes a perovskite layer having a perovskite crystal structure, and a second insulating layer disposed between the Heusler layer and the perovskite layer, the second insulating layer being in contact with both of the Heusler layer and the perovskite layer.

13. The thermoelectric conversion element according to claim 10,
wherein the laminated film includes the perovskite layer, the second insulating layer, and the Heusler layer in order from a side of the laminate.

14. The thermoelectric conversion element according to claim 10,
wherein the Heusler layer is a p-type semiconductor, and the perovskite layer is an n-type semiconductor.

15. The thermoelectric conversion element according to claim 13,
wherein the Heusler layer is a p-type semiconductor, and the perovskite layer is an n-type semiconductor.

16. The thermoelectric conversion element according to claim 4,
wherein a composition of the Heusler layer is represented by $A_xEG$, and $x \geq 2$ is satisfied.

* * * * *